March 28, 1950 H. A. WHEELER 2,501,834

OSCILLATION GENERATOR

Filed July 15, 1947

INVENTOR.
HAROLD A. WHEELER

BY John A. Harvey

ATTORNEY

Patented Mar. 28, 1950 2,501,834

UNITED STATES PATENT OFFICE 2,501,834

OSCILLATION GENERATOR

Harold A. Wheeler, Great Neck, N. Y., assignor to Hazeltine Research, Inc., Chicago, Ill., a corporation of Illinois Application July 15, 1947, Serial No. 761,113

15 Claims. (Cl. 250—36)

Figures 1, 2, 3:
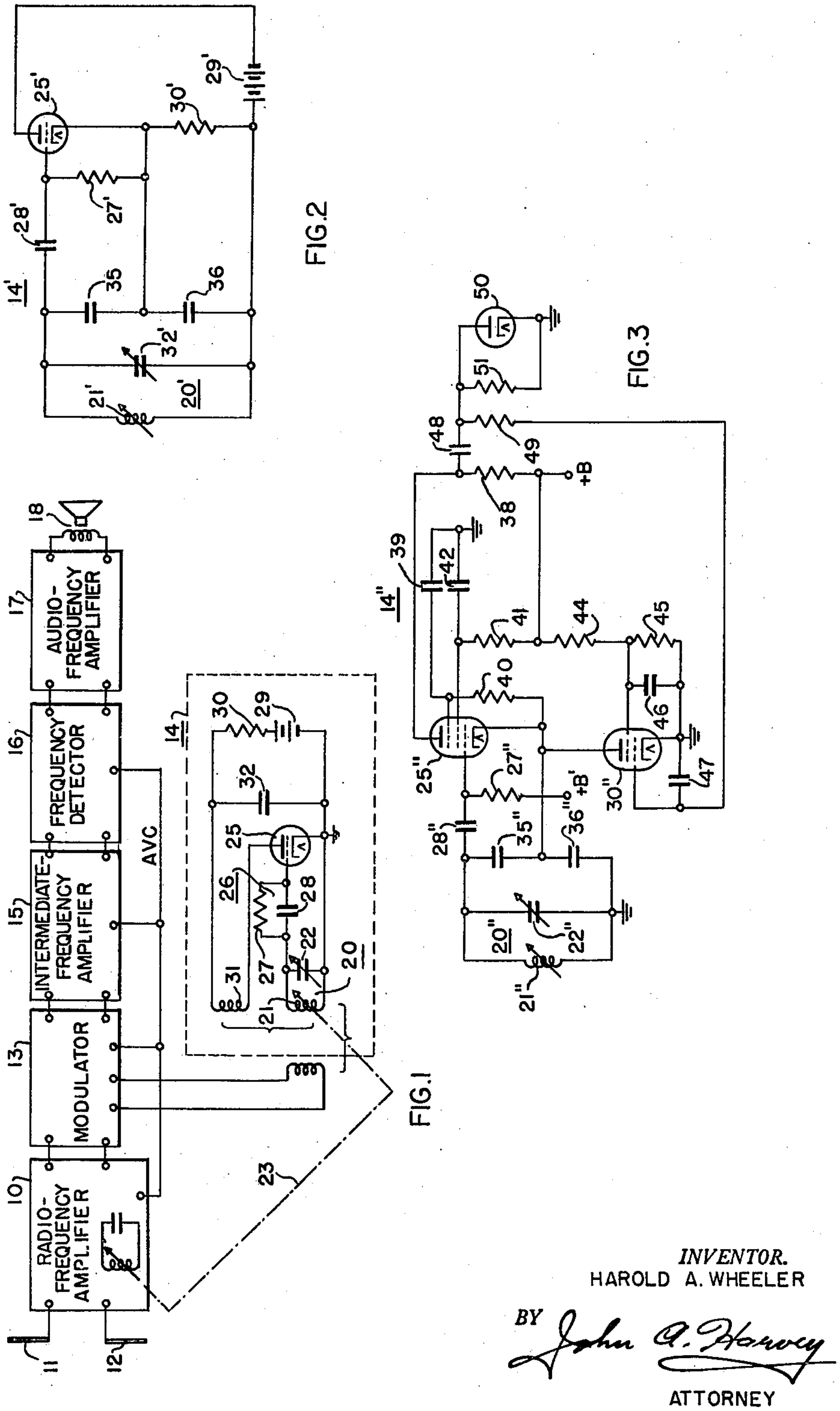

This invention relates to oscillation generators and, particularly, to oscillation generators adapted for operation at any frequency within a relatively wide range of frequencies.

Many conventional oscillation generators employ resistor-condenser self-bias networks in the input circuits thereof. Besides permitting such an oscillation generator to be self-starting, the input-circuit resistor-condenser network has developed across its condenser a unidirectional potential which acts as a control electrode-cathode bias for the oscillator tube. This bias tends to produce stable oscillation in a manner which may briefly be described as follows, it being initially assumed that the generator is generating oscillations of uniformly constant amplitude and is supplying oscillatory energy to a load device. If the amplitude of oscillation tends to increase due to a change in the load or other operating condition, the above-mentioned bias increases to decrease the interval of anode-current flow during each oscillation cycle and thereby tends to maintain the amplitude of oscillation substantially unchanged or at an equilibrium value. Conversely, if the amplitude of oscillation tends to decrease as a result of a change in some operating condition, the bias decreases to increase the interval of anode-current flow and thereby again tends to maintain the amplitude of oscillation substantially constant at the above-mentioned equilibrium value.

This stabilizing or regulating action in oscillation generators heretofore proposed prevails only when the time constant of the resistor-condenser network is smaller than the well-known time constant of damping of the frequency-determining circuit of the oscillation generator. Such oscillation generators may readily be built to perform satisfactorily at a single frequency or over a relatively narrow range of frequencies. Considerable difficulty is encountered, however, in constructing prior oscillation generators of the type under consideration for stable operation at any frequency within a comparatively wide range of frequencies. One reason for this is that the fixed time constant of the resistor-condenser network in the input circuit of the oscillator cannot be designed to effect the most favorable operation over the entire wide range of frequencies. For example, a resistor-condenser network having a large time constant is necessary for satisfactory operation over a low-frequency portion of the frequency range of the generator in order that the network may maintain the control electrode-cathode bias of the oscillator tube sufficiently constant throughout each of the relatively long operating cycles. At the higher operating frequencies of a relatively wide frequency range, however, this large time constant of the network proves to be so large that the control electrode-cathode bias potential is unable to readjust itself sufficiently fast to follow variations of the amplitude of oscillations resulting from changes in operating conditions. Consequently, an overload condition may reduce the feed-back excitation supplied from the output circuit to the input circuit of the oscillation generator to such an extent that the excitation voltage no longer exceeds the bias potential. This condition may prevail for a period of many cycles so that the oscillation generator ceases to operate or blocks. When the bias potential provided by the charge on the network condenser decays to a value less than the excitation potential, the oscillation generator resumes operation. It soon thereafter ceases to oscillate again for the reasons stated above, thus causing intermittent operation at an audio-frequency or radio-frequency rate or which may exist in more pronounced form often called blocking. For stable operation at the higher operating frequencies, therefore, the input circuit of heretofore proposed oscillation generators should have a time constant which is much smaller than normally provided for low-frequency operation. An oscillation generator of the last-mentioned type with an input circuit having a small time constant would not provide good frequency stability in the low-frequency portion of its operating range due to an undesirable phase shift introduced by the time-constant circuit. This phase shift, by altering the desired 180° relation between the input and output circuit voltages, would cause frequency instability in the aforesaid portion of the operating range.

It will be seen, therefore, that the resistor-condenser network used in the input circuit of a conventional oscillation generator should have for best operation widely different time constants depending upon the particular portion of the wide range of frequencies in which the generator is to be operated at any given time. A compromise value for the input-circuit time constant may undesirably result in a faulty operation or a complete lack of operation in some portion of the aforesaid wide range so that such an expedient is impractical when operation at any frequency within a wide range of frequencies is required.

For some high-frequency applications, it is desirable to employ in the input circuit of an oscillation generator a resistor-condenser network including a condenser having a relatively large value of capacitance and a resistor having a large resistance value. The network then has, of course, a correspondingly large time constant. A control electrode-cathode resistor having a large value of resistance may be required, for example, to avoid unnecessarily loading the generator tuned circuit which is coupled in circuit with the resistor-condenser network. This requirement, together with that of stabilized operation over a very wide frequency range, therefore presents a difficult problem. In addition to the foregoing requirements, it may also be desirable for some applications that the oscillator maintain its amplitude of oscillation substantially constant at any frequency within a relatively wide range of frequencies. In practice these several requirements are not easy to achieve.

It is an object of the present invention, therefore, to provide a new and improved oscillation generator which avoids one or more of the above-mentioned disadvantages and limitations of prior such generators.

It is another object of the invention to provide a new and improved oscillation generator adapted to have high operating stability at any frequency within a wide range of frequencies and one which tolerates the use of an input-circuit resistor-condenser self-bias network having a large time constant.

It is a further object of the invention to provide a new and improved oscillation generator which has a substantially reduced tendency to exhibit intermittent operation over at least a major portion of a relatively wide range of operating frequencies.

It is yet another object of the invention to provide a new and improved oscillation generator which not only has a reduced tendency to generate intermittent oscillations at any frequency within a relatively wide range of operating frequencies but also is one which maintains the oscillation amplitude substantially constant over the entire range.

In accordance with a particular form of the invention, an oscillation generator adapted for operation at any frequency within a relatively wide range of frequencies comprises an oscillatory circuit having a predetermined time constant of damping and means, including a conductance-controlling circuit, coupled to the oscillatory circuit for generating oscillations therein. The conductance-controlling circuit includes an energy-storage impedance network having a time constant longer than the aforesaid time constant of damping so that the generation of oscillations tends to be intermittent at frequencies within at least a portion of the above-mentioned relatively wide range of frequencies. The oscillation generator also includes an energizing circuit for the aforesaid means including energy-limiting and energy-storage impedance means providing with the first-mentioned means a time constant shorter than the time constant of damping, substantially to reduce the tendency of the oscillation generation to be intermittent over the aforesaid portion of said frequency range.

For a better understanding of the present invention, together with other and further objects thereof, reference is had to the following description taken in connection with the accompanying drawing, and its scope will be pointed out in the appended claims.

Referring now to the drawing, Fig. 1 is a circuit diagram, partly schematic, of a complete frequency-modulation wave-signal receiver which includes an oscillation generator embodying the present invention in a particular form; and Figs. 2 and 3 are schematic circuit diagrams of oscillation generators embodying the present invention in modified forms.

Referring now to Fig. 1 of the drawing, there is represented a complete frequency-modulation wave-signal receiver of somewhat conventional design which utilizes an oscillation generator embodying one form of the present invention. In general, the receiver includes a radio-frequency amplifier 10 of one or more stages having an input circuit coupled to an antenna system 11, 12 and having an output circuit coupled to a modulator 13. The modulator 13 comprises a unit of a frequency converter which includes an oscillation generator 14, more fully to be described hereinafter. Coupled in cascade with the modulator 13 in the order named are an intermediate-frequency amplifer 15 of one or more stages, a frequency detector 16, an audio-frequency amplifier 17 and a sound-reproducing device 18. An automatic-amplification-control or A. V. C. output circuit of the frequency detector 16 is coupled to the input circuit of one or more of the tubes of the radio-frequency amplifier 10, the modulator 13, and the intermediate-frequency amplifier 15 in order to maintain the amplitude of the signal input to the frequency detector 16 within a relatively narrow range for a relatively wide range of received signal intensities.

It will be understood that the various units just described may, with the exception of the oscillation generator 14, be of conventional construction and operation, the details of which are well known in the art so that further detailed description thereof is unnecessary.

Considering briefly the operation of the receiver as a whole, but neglecting for the moment the detailed operation of the oscillation generator 14 presently to be described, a desired frequency-modulated wave signal is intercepted by the antenna system 11, 12, selected and amplified by the radio-frequency amplifier 10, and converted by the frequency converter including the units 13 and 14 to a frequency-modulated intermediate-frequency wave signal which is amplified by the intermediate-frequency amplifier 15. The output signal of the latter is applied to the frequency detector 16 which derives the audio-frequency modulation components of the received wave signal. These audio-frequency components are, in turn, amplified in the audio-frequency amplifier 17 and are reproduced by the signal-reproducing device 18 in a conventional manner. The automatic-amplification-control or A. V. C. bias derived by the frequency detector 16 is effective to control the amplification of one or more of the units 10, 13, and 15 to maintain the intensity of the signal input to the frequency detector 16 within a relatively narrow range for a wide range of received signal intensities.

Referring now more particularly to the portion of the receiver embodying the present invention, the oscillation generator 14 there represented is adapted for operation at any frequency within a relatively wide range of frequencies and comprises an oscillatory circuit 20 having a predetermined time constant of damping. This time constant is determined by the losses in the oscillatory circuit as is well known in the art. The oscillatory circuit 20 comprises a parallel-resonant circuit including an adjustable inductor 21, the inductance value of which may be conventionally controlled by a ferromagnetic core, and a variable condenser 22. The inductor 21, which is inductively coupled to an input circuit of the modulator 13, is adjustable to adjust the resonant frequency of the oscillatory circuit 20 and, accordingly, is unicontrolled as indicated by the broken line 23 with one or more similar tuning elements in the radio-frequency amplifier 10.

The oscillation generator also includes means, including a conductance-controlling circuit, coupled to the oscillatory circuit 20 for generating oscillations therein. This means comprises an electron tube 25 which is capable of providing amplification and having the usual input and output electrodes. The conductance-controlling circuit mentioned comprises the input electrode circuit of the amplifier tube 25 and is connected to the opposite ends of the oscillatory circuit 20. The conductance-controlling circuit includes an energy-storage impedance network 26, specifically a parallel-connected resistor 27 and condenser 28, having a time constant longer than the time constant of damping of the oscillatory circuit 20 for reasons presently to be explained. Because of this long time constant, the generation of oscillations tends to be intermittent at frequencies within at least a portion of the desired operating frequency range of the oscillation generator 14 for reasons previously stated.

The oscillation generator 14 further includes an energizing circuit for the amplifier tube 25 including energy-limiting and energy-storage impedance means providing with the tube 25 a time constant shorter than the time constant of damping, thereby substantially to reduce the tendency of the oscillation generation of unit 14 to be intermittent over the above-mentioned portion of the frequency range of unit 14. This energizing circuit includes an energy-supply means 29, such as a battery, one terminal of which is connected to the grounded cathode of the amplifier tube 25 while the other terminal thereof is connected to the anode of the tube through an energy-limiting means comprising a resistor 30 and through a feed-back winding 31 inductively coupled with the winding 21 of the oscillatory circuit 20. The energy-storage impedance means last mentioned comprises a condenser 32, having a low impedance for signals of oscillation frequency, which is coupled across the series combination of the battery 29 and the resistor 30. The resistor 30 preferably has a value of resistance which is greater than the anode-to-cathode resistance of the amplifier tube 25 in its oscillating state to provide a current-regulating action with respect to the space-current flow through the tube. As employed throughout the specification and claims, the term "anode-to-cathode resistance" or more simply the "anode resistance" of an electron tube is intended to designate the quotient comprising the average anode-cathode voltage and the average space current translated by the tube. The resistor 30 and the condenser 32 effectively provide with the anode resistance of the amplifier tube 25 a time constant which is short with respect to the time constant of damping of the resonant circuit 20 for stabilizing the oscillator 14 in a manner presently to be considered in greater detail.

Considering now the operation of the oscillation generator just described, it will be manifest that the oscillator 14 is of the so-called tuned-grid type wherein feedback of energy from the output circuit of the amplifier tube 25 to the input circuit thereof, to overcome losses in the oscillatory circuit 20, is by the inductive coupling between the winding 31 and the inductor 21. As is well known, the input electrodes of the tube 25 introduce during a portion of each oscillation cycle a negative resistance into the oscillatory circuit 20 so to control the conductance thereof as to generate oscillations. However, it was mentioned above that the time constant of the resistor-condenser network 26 is longer than the time constant of damping of the resonant circuit 20 over the tuning range thereof. It is the purpose of this long time constant to minimize loading of the oscillatory circuit 20 particularly at the high-frequency end of the operating range and further to assure good low-frequency operation. The generation of oscillations by unit 14, were it of conventional construction, would consequently tend to be intermittent at operating frequencies within at least a portion of the wide frequency range over which it is desired that the unit operate. In particular, the generation of oscillations would ordinarily tend to be intermittent at the high-frequency portion of the frequency range of the oscillation generator. The reasons for this have already been mentioned. Thus, control electrode-cathode circuit stabilization is ineffective over all of this desired frequency range of the oscillation generator 14.

Contrary to the usual procedure, effective stabilization of the oscillator 14 is procured in its energizing or anode-cathode circuit by the described proportioning of the values of the elements thereof even though the parameters of the conductance-controlling circuit would seem to counteract such stabilization. The time constant of the anode-cathode circuit may be considered to comprise the product of the capacitance of the condenser 32 and the effective parallel resistance of the resistor 30 and the anode resistance of the tube 25. However, when the value of the resistor 30 is high with respect to the anode resistance of the tube 25 as is desirable in most applications, for practical purposes the effective time constant of the anode-cathode circuit is the product of the capacitance of the condenser 32 and the anode resistance of the tube 25. Applicant has found that when the time constant of the anode-cathode circuit of the oscillation generator is shorter than the time constant of damping of the oscillatory circuit 20 and the time constant of the conductance-controlling circuit is greater than the time constant of the anode-cathode circuit, that a very effective and substantial stabilizing action on the operation of the oscillation generator is provided by the anode-cathode circuit thereof. Thus when oscillations in the oscillatory circuit 20 begin to diminish in amplitude, less average space current flows and the anode-cathode circuit potential quickly rises to increase the transconductance of the tube 25 and thereby increase the amplitude of oscillation to the equilibrium value. The converse action occurs upon an increase of the oscillation amplitude. This stabilization is performed at such a rate that the resistor-condenser network 26, with its larger time constant and hence slower recovery rate, is not called upon to provide any stabilizing action. Due to the faster recovery of the anode-cathode circuit, a negative charge of sufficient magnitude to interrupt oscillations cannot be developed across the condenser 28 at any operating frequency within the very wide range over which the oscillator 14 is to operate.

The resistor 30 also assists somewhat in the stabilizing action due to the high value of resistance thereof as compared with that of the other portions of the anode-cathode circuit of the oscillation generator 14. Thus the total effective resistance in the output circuit of the tube 25 is so high that variations of the anode-cathode resistance of the tube are relatively small in comparison therewith. Consequently, the resistor 30 acts as a regulator which tends to maintain the unidirectional component of current in the anode-cathode circuit of the oscillation generator substantially uniform with any changes of the load on the generator which ordinarily may be experienced. Therefore, the action of the energy-limiting resistor 30 and the energizing circuit of the tube 25 with its particular time constant are effective to reduce, and in fact to avoid, any tendency of the oscillation generation of the unit 14 to be intermittent over any portion of the relatively wide frequency range thereof despite the fact that the conductance-controlling circuit is characterized by a very long time constant.

While the particular form of the invention represented by Fig. 1 has been described in connection with the so-called tuned-grid oscillation generator, the invention is equally useful in other types of oscillation generators. For example, in Fig. 2 of the drawing there is represented schematically an oscillation generator embodying the present invention in a modified form. This oscillation generator is generally similar to that of Fig. 1 and corresponding circuit elements are designated by the same reference numerals primed. In the present generator, the anode and control electrode of the tube 25′ are coupled to opposite ends of the oscillatory system 20′, the control electrode being coupled to one end thereof through the coupling condenser 28′ while the anode is coupled to the other end thereof through the battery 29′. The negative terminal of the battery 29′ is connected to the cathode of the tube through the current-regulating resistor 30′. A capacitive voltage divider comprising series-connected condensers 35 and 36 is connected to the opposite ends of the oscillatory circuit 20′. The resistor 27′ is connected between the control electrode and the cathode of the tube to provide a direct-current path therebetween. The cathode of the tube 25′ is connected to the junction of the condensers 35 and 36.

The resistor 27′ and the condenser 28′ comprise an energy-storage impedance network in the conductance-controlling input circuit of the oscillation generator. These elements have a time constant which is longer than the time constant of damping of the oscillatory circuit 20′ just as in the Fig. 1 arrangement. The resistor 30′, which has a high value of resistance with respect to the anode resistance of the tube 25′, and the condenser 36 in conjunction with the condenser 35 comprise the energy-limiting and the energy-storage impedance means which provide with anode resistance of the tube 25′ a time constant which is shorter than the time constant of damping of the oscillatory circuit 20′. Since the resistance value of the resistor 30′ is large with respect to the anode resistance of tube 25′, the time constant of the energizing circuit of the oscillation generator is effectively equal to the product of the anode resistance of tube 25′ and the sum of the capacitance values of the condensers 35 and 36. Excitation voltage for the conductance-controlling input circuit is applied across the condenser 35 by the output circuit of tube 25′. Due to the action of the current-regulating resistor 30′ and the particular proportioning of the above-mentioned time-constant circuits, the oscillation generator 14′ has no tendency to develop intermittent oscillations over any portion of the relatively wide frequency range of the generator, even with an oscillatory circuit having a relatively low Q.

The following circuit constants are given as illustrative of values of circuit elements which may be utilized in the circuit of Fig. 2:

| | |
|---|---|
| Condenser 32′ | 0–1000 micromicrofarads |
| Condenser 28′ | 0.01 microfarad |
| Condenser 35 | 0.0012 microfarad |
| Condenser 36 | 0.006 microfarad |
| Resistor 27′ | 1.0 megohm |
| Resistor 30′ | 20 kilohms |
| Inductor 21′ | 10 microhenries to 10 millihenries |
| Battery 29′ | 200 volts |
| Tube 25′ | Type 6J5 |
| Frequency range | 35 kilocycles – 1.6 megacycles |

Referring now to Fig. 3 of the drawing, there is represented schematically a further modification of an oscillation generator in accordance with the present invention. This generator is similar in many respects to the oscillation generator of Fig. 2 and, accordingly, corresponding elements are designated by the same reference numerals double primed. The tube 25″ preferably is of the pentode type rather than of the triode type as shown in the Fig. 2 arrangement. The anode and the screen electrode of the tube 25″ are connected to an energizing source, indicated +B, through respective resistors 38 and 41. The screen electrode is also grounded through a by-pass condenser 42. The suppressor electrode is coupled to ground through a by-pass condenser 39 and is also coupled to the cathode of tube 25″ through a resistor 40. The control electrode of the tube 25″ is connected to a bias source, indicated +B′, through the resistor 27″. The resistor 27″ and the condenser 28″ in the conductance-controlling input circuit of the tube 25″ preferably have a time constant which is larger than the time constant of damping of the oscillatory circuit 20″. The impedance values of the elements 27″ and 28″ are such that they contribute little to the loading of the oscillatory circuit 20″.

The energizing circuit of the tube 25″, besides including the source +B, includes a current-regulating device preferably comprising a beam-tetrode type of electron tube 30″, which tube is characterized by its very high anode-to-cathode resistance despite variations of the transconductance of the tube. The anode of the tube 30″ is connected to the cathode of tube 25″ and the cathode of the former is grounded. Thus it will be seen that the space-current path of the tube 30″ is included in the cathode circuit of the tube 25″ in the same general manner as the resistor 30′ of the Fig. 2 embodiment. Also as in the Fig. 2 arrangement, the tube 30″ and the condensers 35″ and 36″ comprise, respectively, energy-limiting and energy-storage impedance means providing with the tube 25″ a time constant which is shorter than the time constant of damping of the oscillatory circuit 20″. The screen electrode of the tube 30″ is connected to the energizing source +B through a resistor 44 and to ground through a resistor 45. The screen and control electrodes of tube 30″ are coupled to ground through by-pass condensers 46 and 47, respectively.

The oscillation generator 14″ also includes means responsive to the amplitude of the oscillations generated thereby for controlling the energy translated by the tube 30″ and the condensers 35″ and 36″ to maintain the oscillation amplitude substantially constant and, further, substantially to reduce the tendency of the oscillation generator to generate oscillations intermittently at any frequency in the desired frequency range thereof. This means includes a rectifier device 50, the anode of which is connected to the anode of the tube 25″ through a coupling condenser 48. The anode of the rectifier device 50 is connected to the grounded cathode thereof through a load resistor 51 and is also connected to the control electrode of the tube 30″ through a resistor 49. Device 50 may therefore be said to be electron coupled to the oscillatory circuit 20″ through the tube 25″.

Considering now the operation of the oscillation generator of Fig. 3, it will be clear in view of the general similarity of the arrangement with that represented in Fig. 2 that the two generators have essentially similar modes of operation. Because of the values of the time constants of the oscillatory circuit 20″ and that of the anode-cathode circuit of the tube 25″, and also because of the very high anode resistance afforded by the beam-tetrode tube 30″, any tendency of oscillation generator 14″ to generate oscillations intermittently over the entire wide frequency range thereof is substantially avoided. The rectifier device 50 is effective to derive a unidirectional control effect or potential across the load resistor 51 proportional to the amplitude of the generated oscillations, and this control potential is applied as a bias to the control electrode of the tube 30″ through the resistor 49. This bias controls the magnitude of the space-current flow through the series-connected tubes 25″ and 30″. Should there be any tendency for the amplitude of the generated oscillations to vary for reasons such as a change in the load on the oscillation generator 14″, the magnitude of the bias developed by the rectifier device 50 varies in the same sense with the change in the oscillation amplitude and alters the space-current flow in the tube 30″ accordingly. This in turn alters the space-current flow through the tube 25″ and correspondingly varies the transconductance thereof. The transconductance of tube 25″ is modified in the proper sense to return the amplitude of oscillation substantially to the original value thereof. Thus the oscillation generator 14″ not only generates oscillations having a substantially constant amplitude over the entire wide operating frequency range of the generator but also is not subject to intermittent operation over such frequency range. Over some portions of the frequency range of the oscillator 14′, it may operate without drawing control electrode-cathode current. This is a very unusual condition in an oscillator operating over a relatively wide frequency range.

A similar automatic-amplification-control action may also be obtained when the condenser 48 is connected to the ungrounded end of the oscillatory circuit 20″ instead of to the anode of the tube 25″. For some applications, it may prove more convenient to couple the rectifier device 50 directly to the oscillatory circuit as mentioned. When this is done, however, the rectifier device 50 applies a greater load to the tuned circuit of the oscillation generator.

While applicant does not wish to be limited to any particular values of circuit constants, the following circuit constants have proved useful in connection with an embodiment of the invention in accordance with the representation of Fig. 3:

| | |
|---|---|
| Condenser 22″ | 0–0.001 microfarad |
| Condensers 28″, 36″, 39, and 47 | 0.005 microfarad |
| Condenser 35″ | 0.001 microfarad |
| Condensers 42 and 46 | 0.05 microfarad |
| Condenser 48 | 0.002 microfarad |
| Resistors 27″, 40, 49, and 51 | 2 megohms |
| Resistors 38 and 41 | 20 kilohms |
| Resistor 45 | 10 kilohms |
| Inductor 21″ (individual plug-in type elements) | 10 microhenries<br>100 microhenries<br>1 millihenry<br>10 millihenries<br>100 millihenries |
| Tube 25″ | Type 6AB7 |
| Tube 30″ | Type 6V6 |
| Tube 50 | Type 6H6 |
| +B′ | 35 volts |
| +B | 200 volts |
| Anode resistance of tube 25″ | 5,000–20,000 ohms[1] |
| Time constant of energizing circuit of tube 25″ | Less than 30–120[1] microseconds |
| Time constant of damping of oscillatory circuit 20″ | 50–1,000 microseconds[1] |
| Time constant of input circuit of tube 25″ | 10,000 microseconds |
| Frequency range | 11 kilocycles–1.6 megacycles |

[1] The first value applies when a 10-microhenry inductor 21″ is employed and the second value pertains when a 100-millihenry inductor is utilized.

It will be apparent from the foregoing description that an oscillation generator embodying the present invention, although adapted to employ in the input circuit thereof a resistor-condenser network having a very large time constant, has a materially reduced tendency to generate intermittent oscillations over any portion of a relatively wide range of operating frequency. It will also be manifest that an oscillation generator in accordance with a particular form of the invention, besides having a reduced tendency to generate intermittent oscillations over a wide frequency range, is adapted to maintain the oscillation amplitude substantially constant over such range.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at frequencies within at least a portion of said range; and an energizing circuit for said means including energy-limiting and energy-storage impedance means providing with said first-mentioned means a time constant shorter than said time constant of damping substantially to reduce said tendency of said oscillation generation to be intermittent over said portion of said range.

2. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance-controlling circuit including an energy-storage impedance network having a time constant longer than said time constant of damping so that the generation of said oscillations is intermittent at frequencies within at least a portion of said range; and an energizing circuit for said means including energy-limiting and energy-storage impedance means providing with said first-mentioned means a time constant shorter than said time constant of damping so that said intermittent oscillation generation is avoided over said portion of said range.

3. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at the high-frequency portion of said range; and an energizing circuit for said means including energy-limiting and energy-storage impedance means providing with said first-mentioned means a time constant shorter than said time constant of damping substantially to reduce said tendency of said oscillation generation to be intermittent over said high-frequency portion of said range.

4. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at frequencies within at least a portion of said range; and an energizing circuit for said means including a constant-current device and an energy-storage impedance means providing with said first-mentioned means a time constant shorter than said time constant of damping substantially to reduce said tendency of said oscillation generation to be intermittent over said portion of said range.

5. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at frequencies within at least a portion of said range; and an energizing circuit for said means including a constant-current electron tube and an energy-storage impedance means providing with said first-mentioned means a time constant shorter than said time constant of damping substantially to reduce said tendency of said oscillation generation to be intermittent over said portion of said range.

6. An oscillation generator adapted for operation at any frequency within a relatively wide range of frequencies comprising: an oscillatory circuit having a predetermined time constant of damping; an electron tube, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at frequencies within at least a portion of said range; and an energizing circuit for said tube including energy-limiting and energy-storage impedance means providing with the anode resistance of said tube a time constant shorter than said time constant of damping substantially to reduce said tendency of said oscillation generation to be intermittent over said portion of said range.

7. An oscillation generator adapted for operation at any frequency within a relatively wide range of frequencies comprising: an oscillatory circuit having a predetermined time constant of damping; an electron tube, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at frequencies within at least a portion of said range; and an energizing circuit for said tube including a condenser and a current-regulating electron tube providing with the anode resistance of said first-mentioned tube a time constant shorter than said time constant of damping substantially to reduce said tendency of said oscillation generation to be intermittent over said portion of said range.

8. An oscillation generator adapted for operation at any frequency within a relatively wide range of frequencies comprising: an oscillatory circuit having a predetermined time constant of damping; an electron tube, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at frequencies within at least a portion of said range; and an energizing circuit for said tube including a condenser and a current-regulating electron tube having a high anode resistance providing with the anode resistance of said first-mentioned tube a time constant shorter than said time constant of damping substantially to reduce said tendency of said oscillation generation to be intermittent over said portion of said range.

9. An oscillation generator adapted for operation at any frequency within a relatively wide range of frequencies comprising: an oscillatory circuit having a predetermined time constant of damping; an electron tube, including a conductance-controlling circuit, coupled to said oscillatory circuit for generating oscillations therein; said conductance-controlling circuit including an energy-storage impedance network having a time constant longer than said time constant of damping so that the generation of said oscillations tends to be intermittent at frequencies within at least a portion of said range; and an energizing circuit for said tube including a condenser and a resistor having a high value of resistance with reference to the anode resistance of said tube and providing with said anode resistance a time constant shorter than said time constant of damping substantially to reduce said tendency of said oscillation generation to be intermittent over said operation of said range.

10. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance controlling circuit including an energy-storage impedance network having a time constance longer than said time constant of damping so that said generation of said oscillations tends to become intermittent at frequencies within at least a portion of said range; an energizing circuit for said means including energy-limiting and energy-storage impedance means providing with said first-mentioned means a time constant shorter than said time constant of damping; and means including a rectifier device coupled to said oscillatory circuit and responsive to the amplitude of said generated oscillations for controlling the energy translated by said energy-limiting and energy-storage impedance means to maintain said oscillation ampltiude substantially constant and substantially to reduce any tendency of said generator to generate oscillations intermittently at any frequency in said range.

11. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance-controlling circuit including an energy-storage impedance network having a time constant longer than said time constant of damping so that said generation of said oscillations tends to be intermittent at frequencies within at least a portion of said range; an energizing circuit for said means including energy-limiting and energy-storage impedance means providing with said first-mentioned means a time constant shorter than said time constant of damping; and means responsive to the amplitude of said generated oscillations for controlling the energy translated by said energy-limiting and energy-storage impedance means to maintain said oscillation amplitude substantially constant and substantially to reduce said tendency of said generator to generate oscillations intermittently over said portion of said range.

12. An oscillation generator adapted for operation at any frequency within a relatively wide range of frequencies comprising: an oscillatory circuit having a predetermined time constant of damping; an amplifier tube having input and output electrodes including an anode electrode; an input circuit and an output circuit respectively coupling said input and output electrodes with said oscillatory circuit for controlling the conductance thereof to develop oscillations therein; said input circuit including an energy-storage impedance network having a time constant which is longer than said time constant of damping so that the generation of said oscillations tends to be intermittent at frequencies within a portion of said range; and said output circuit including energy-supply means, energy-limiting means having a value of resistance greater than the anode resistance of said tube, and an energy-storage impedance means, said three means providing with said anode resistance of said tube a time constant shorter than said time constant of damping substantially to reduce said tendency of said oscillation generation to be intermittent over said portion of said range.

13. An oscillation generator adapted for operation at any frequency within a relatively wide range of frequencies comprising: an oscillatory circuit having a predetermined time constant of damping; an amplifier tube having input and output electrodes including an anode electrode; an input circuit and an output circuit respectively coupling said input and output electrodes with said oscillatory circuit for controlling the conductance thereof to develop oscillations therein; said input circuit including a resistor-condenser network having a time constant which is longer than said time constant of damping so that the generation of said oscillations tends to be intermittent at frequencies within a portion of said range; and said output circuit including energy-supply means, means for maintaining the space current of said amplifier tube within a relatively narrow range of values and having a value of resistance greater than the anode resistance of said tube, and an energy-storage impedance means, said three means providing with said anode resistance of said tube a time constant shorter than said time constant of damping substantially to reduce said tendency of said oscillation generation to be intermittent over said portion of said range.

14. An oscillation generator adapted for operation at any frequency within a relatively wide range of frequencies comprising: an oscillatory circuit having a predetermined time constant of damping; a first amplifier tube having input and output electrodes including an anode electrode; an input circuit and an output circuit respectively coupling said input and output electrodes with said oscillatory circuit for controlling the conductance thereof to develop oscillations therein; said input circuit including an energy-storage impedance network having a time constant which is longer than said time constant of damping so that the generation of said oscillations tends to be intermittent at frequencies within a portion of said range; and said output circuit including energy-supply means, a second amplifier tube having an anode resistance at least comparable with the anode resistance of said first tube, and an energy-storage impedance means, said two means providing with said anode resistances of said first and second tubes a time constant shorter than said time constant of damping substantially to reduce said tendency of said oscillation generation to be intermittent over said portion of said range.

15. An oscillation generator adapted for operation at any frequency within a relatively wide range of frequencies comprising: an oscillatory circuit having a predetermined time constant of damping; means, including a conductance-controlling circuit, coupled to said oscillatory circuit for generating oscillations therein; said conductance controlling circuit including an energy-storage impedance network having a time constant longer than said time constant of damping so that said generation of said oscillations tends to become intermittent at frequencies within at least a portion of said range; an energizing circuit for said means including a series-connected amplifier tube and a shunt-connected condenser providing with said first-mentioned means a time constant shorter than said time constant of damping; and means including a rectifier device coupled to said oscillatory circuit for deriving a control effect proportional to the amplitude of said generated oscillations and for applying said control effect to said amplifier tube to vary the transconductance thereof in accordance therewith, thereby to maintain said oscillation amplitude substantially constant and substantially to reduce any tendency of said generator to generate oscillations intermittently at any frequency in said range.

HAROLD A. WHEELER.

REFERENCES CITED

The following references are of record in the file of this patent:

UNITED STATES PATENTS

| Number | Name | Date |
|---|---|---|
| 2,294,171 | George | Aug. 25, 1942 |
| 2,355,606 | Shannon | Aug. 15, 1944 |

OTHER REFERENCES

ARRL Handbook, 1942 edition, page 126, Figure 718B.